United States Patent [19]

Bailey

[11] Patent Number: 4,703,195
[45] Date of Patent: Oct. 27, 1987

[54] PARALLEL GROUNDING SCHEME

[75] Inventor: Carl J. Bailey, San Jose, Calif.

[73] Assignee: Tandem Computers Incorporated, Cupertino, Calif.

[21] Appl. No.: 904,770

[22] Filed: Sep. 5, 1986

Related U.S. Application Data

[63] Continuation of Ser. No. 829,751, Feb. 14, 1986, abandoned, which is a continuation of Ser. No. 551,280, Nov. 14, 1983, Pat. No. 4,621,199.

[51] Int. Cl.⁴ ............................................. H02H 3/00
[52] U.S. Cl. .................................... 307/147; 307/149; 307/327; 361/48; 361/50; 361/104
[58] Field of Search ............... 307/18, 147, 327, 89, 307/149, 150; 361/47–50, 415, 104, 42, 43, 136, 389, 392, 393, 394, 378

[56] References Cited
U.S. PATENT DOCUMENTS

| | | | |
|---|---|---|---|
| 3,581,152 | 5/1971 | Hunt | 361/50 |
| 3,581,153 | 5/1971 | Joyce | 361/50 |
| 3,665,251 | 5/1972 | Buckeridge | 361/48 |
| 3,676,739 | 7/1972 | Neuhouser et al. | 361/48 |
| 3,783,340 | 1/1974 | Becker | 361/50 |
| 3,961,319 | 6/1976 | Asberry | 361/50 X |
| 4,044,395 | 8/1977 | Eckart | 361/48 X |
| 4,228,475 | 10/1980 | Sherwood | 361/47 |
| 4,321,643 | 3/1982 | Vernier | 361/48 |
| 4,389,694 | 6/1983 | Cornwell | 361/47 X |
| 4,393,432 | 7/1983 | Neuhaus et al. | 307/127 X |
| 4,520,419 | 5/1985 | Locher et al. | 307/127 X |

*Primary Examiner*—William M. Shoop, Jr.
*Assistant Examiner*—Shik Luen Paul Ip
*Attorney, Agent, or Firm*—Townsend and Townsend

[57] ABSTRACT

Electronic system grounding includes two system grounding paths for card cage electronic modules, with a first grounding path through the card cage and a second grounding path through the system power supply. The two system grounding paths are used to minimize noise and reduce unwanted induced superimposed transient voltage levels.

6 Claims, 1 Drawing Figure

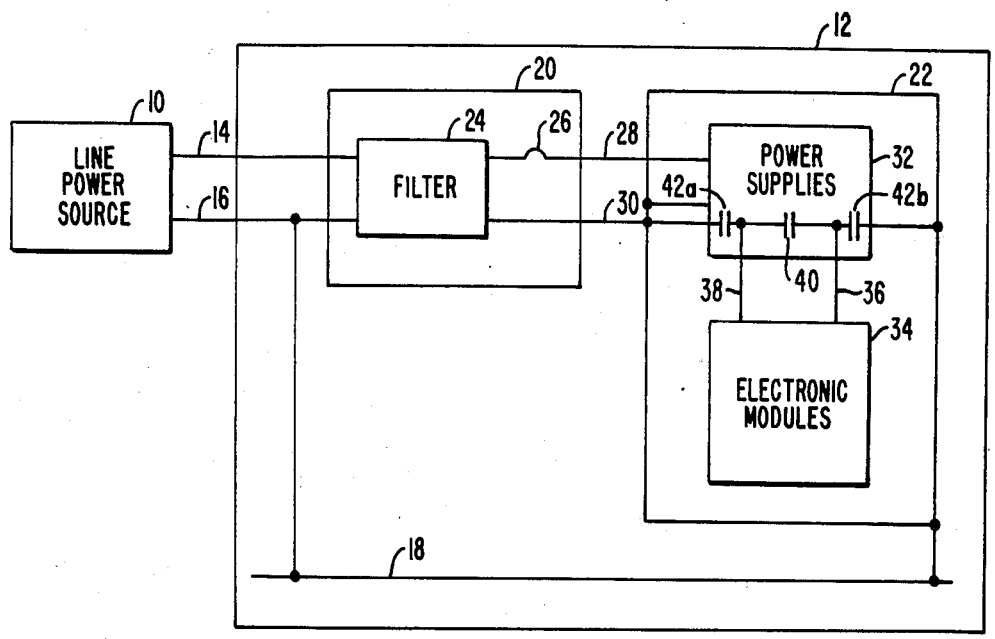

PARALLEL GROUNDING SCHEME

This is a continuation of application Ser. No. 829,751, filed Feb. 14, 1986, now abandoned, which is a continuation of application Ser. No. 551,280, filed Nov. 14, 1983, U.S. Pat. No. 4,621,199.

BACKGROUND

The present invention relates to the grounding of electronic systems. System power supply configurations locate a power supply in a system cabinet. Line power from the outside is connected to the power supply that transforms the line voltage into usable regulated voltage levels. Regulated power is then distributed to various electronic modules within the cabinet. The system cabinet has card cages housing a plurality of electronic card modules.

The power is linearly routed from the input line voltage source to the power supply and then to the card cages. This routing creates a single ground path. The grounding path from the power supply to the card cage provides a single path through which ground currents return to a line power ground.

Grounding currents are restricted to this single path. The noise generated on the single path is in part caused by the current multiplied by the resistance of the path. The disadvantage of the single path is that any resistance on the single path has a direct effect on the amount of noise generated.

SUMMARY

An object of the present invention is to provide improved grounding. The grounding has two separate and parallel grounding paths. Any resistance on a grounding path of the parallel paths does not have as much noise generation had the path not been in parallel. The parallel grounding paths decrease high levels of noise generated by a given level of return ground current. The resistance in each path only generates partially the total noise generated from the currents. The resulting noise generated from the two paths is not as large as the noise generated from a single ground path. The parallel grounding paths provide for reduced noise generation in a computer system. The parallel grounding paths aid in the compliance of electromagnetic interference shielding requirements. The parallel grounding paths are established by the splitting of a grounding wire of the incoming power lines. One path connects to the grounded card cage. The other grounding path connects to the ground line of the power supply. The power supply ground line is connected to the electronic modules. The power supply is also electrically connected to the grounded card cage which is grounded. The ground currents of the line power source return either through the card cage ground path or the power supply ground path.

DRAWING DESCRIPTION

The drawing depicts power distribution routes in a system cabinet wherein is a parallel grounding path.

PREFERRED EMBODIMENT

Referring to the drawing, an input three phase power source 10 is connected to a system cabinet 12 through power lines 14 and a ground line 16. Additionally, the ground line 16 electrically connects to a cabinet frame 18. The system cabinet 12 houses a power distribution unit 20 and a plurality of card cages 22. The power lines 14 and the ground line 16 are connected to the power distribution unit 20. The power distribution unit 20 houses an electromagnetic interference filter. 24 and circuit breakers 26. The electromagnetic interference filter 24 supplies filtered power on line 28 and filtered ground on line 30 to the card cages 22. The card cages 22 house a plurality of power supplies 32 and a plurality electronic modules 34.

The power supplies 32 receive power from the power distribution unit 20 and in turn supplies regulated power on lines 36 to the electronic modules 34. Additionally, the power supplies 36 supply regulated power ground on lines 32. The power supplies 32 are connected to backplanes, not shown, of the card cage 22. The backplanes, not shown, are connected to the electronic modules 34. The backplanes, not shown, route regulated power on lines 36 and regulated power ground on lines 38 to the electronic modules 34. The lines 36 and 38 are filtered by capacitors 40.

The input three phase power source 10 sources power ground on ground line 16. The line 16 is also connected to the cabinet frame 18. The cabinet frame 18 is electrically connected to the card cages 2 that are, in turn, electrically connected to the power supplies 32. The power supplies 32 are connected to the card cages 22 through slotted guides, not shown, of the card cages 22. Metal etched conductors, not shown, of the power supplies 32 connected through capacitors 42a and 42b to the slotted guides, not shown, of card cages 22. The slotted guides, not shown, support the power supplies 32 and the electronic modules 34 in the card cages 22.

The input power ground on ground line 16 is connected to the power supplies 32 in a parallel connection. The power supplies 32 are connected to ground line 16 by parallel ground paths that are firstly through the power distribution unit 20, and secondly through the card pages 22 and the cabinet frame 18. These parallel ground paths provide a decreased resistance through which a given current results in a decreased amount of radiated noise. This decrease amount of radiated noise improves the operation of the electronic modules 34.

The regulated power on lines 36 and the ground signal on lines 38 are connected to each other through the filter capacitors 40 as is a common practice in the art. However, the power supplies 32 are connected electrically to the grounded card cages 22 through filter capacitor 42a and 42b.

The filter capacitors 42a connect the ground lines 38 to the grounded card cages 22, and the filter capacitors 42b connect the regulated power lines 36 to the grounded card cages 22. The capacitors 42 are used to minimize noise and the capacitors 42 present a low impedance path to the electrically grounded card cages 22. Consequently, this AC (alternating current) path shunts noise signals to the grounded card cages 22.

What is claimed is:

1. In an electronic system that is supplied a line power and a line ground by a line power means, the system having a frame electrically coupled to the line ground, a grounding scheme comprising:

a card cage electrically coupled to the frame, said card cage receiving an electronic module;

power supply means for providing power and ground to the electronic module, said power supply means being coupled to the electronic module and housed within said card cage;

coupling means for electronically coupling said power supply means to the line power means;

a first ground path means electrically coupling the line ground to said power supply means; and a second ground path means formed by said card cage and the frame electrically coupling the line ground to said power supply means in parallel with said first ground path means so as to decrease the amount of radiated noise.

2. A system as in claim 1 further comprising a backplane means interconnecting the electronic module with said power supply means for supplying regulated power to said electronic module.

3. A system as in claim 1 wherein said electronic coupling means further includes an electromagnetic interference filter means coupled to the line power means for filtering the line power and the line ground.

4. A system as in claim 2 wherein said electronic coupling means further includes electromagnetic interference filter coupled to the line power means for filtering line power and line ground coupled to the line power means.

5. In an electronic system including a cabinet having a housing and frame, one or more card cages electrically coupled to the frame, each card cage receiving an electronic module and having a power supply means integrated therein so as to provide power and ground to the electronic module, an electronic coupling means electrically coupled to the power supply and line power means for supplying line power and line ground coupled to the electronic coupling means wherein line ground is also electrically coupled to the frame, an improved grounding scheme wherein the improvement comprises:

a first ground path means for grounding the power supply electrically coupling the line ground to the power supply, said first grounding path means conducting current and running between the line ground and power supply; and a second ground path means for grounding the power supply electrically coupling the line ground to the power supply through the card cage and frame, said second ground path means conducting current and running through the card cage and frame between the line ground and the power supply, said second ground path means being connected in parallel with said first ground path means so as to decrease the amount of radiated noise.

6. In an electronic system including a cabinet having a housing and frame, one or more card cages electrically coupled to the frame, each card cage receiving an electronic module and having a power supply means integrated therein so as to provide power and ground to the electronic module, an electronic coupling means electrically coupling to the power supply, and line power means for supplying line power and line ground to the power supply connected to the electronic coupling means wherein the line ground is also electrically coupled to the frame, an improved method for grounding the power supply wherein the improvement comprises;

electrically connecting the line ground to the power supply for providing a first ground path so as to ground the power supply; and electrically connecting the line ground to the power supply through the card cage in parallel with said first ground path so as to ground the power supply and decrease the amount of radiated noise.

* * * * *